US010403347B2

(12) United States Patent
Nagata

(10) Patent No.: US 10,403,347 B2
(45) Date of Patent: Sep. 3, 2019

(54) APPARATUSES AND METHODS FOR ACCESSING FERROELECTRIC MEMORY INCLUDING PROVIDING REFERENCE VOLTAGE LEVEL

(71) Applicant: Micron Technology, Inc., Boise, ID (US)

(72) Inventor: Kyoichi Nagata, Miyamae-ku (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/882,881

(22) Filed: Jan. 29, 2018

(65) Prior Publication Data

US 2019/0237122 A1 Aug. 1, 2019

(51) Int. Cl.
*G11C 11/22* (2006.01)

(52) U.S. Cl.
CPC ........ *G11C 11/2273* (2013.01); *G11C 11/221* (2013.01); *G11C 11/2257* (2013.01); *G11C 11/2259* (2013.01); *G11C 11/2275* (2013.01)

(58) Field of Classification Search
CPC ....... G11C 11/00; G11C 11/22; G11C 11/221; G11C 11/223; G11C 11/5667; G11C 11/2273; G11C 11/2257; G11C 11/2259; G11C 11/2275
USPC ........................................................ 365/145
See application file for complete search history.

(56) References Cited

U.S. PATENT DOCUMENTS

| 6,097,623 | A  | * | 8/2000  | Sakata  | G11C 11/22 |
|           |    |   |         |         | 365/145 |
| 6,320,178 | B1 | * | 11/2001 | Miller  | H01L 31/0203 |
|           |    |   |         |         | 250/214 C |
| 6,545,902 | B2 | * | 4/2003  | Sakata  | G11C 11/22 |
|           |    |   |         |         | 365/145 |
| 6,920,059 | B2 | * | 7/2005  | Jacob   | G11C 11/22 |
|           |    |   |         |         | 365/145 |
| 2002/0027799 | A1 | * | 3/2002 | Sakata | G11C 11/22 |
|           |    |   |         |         | 365/145 |
| 2004/0105293 | A1 | * | 6/2004 | Jacob  | G11C 11/22 |
|           |    |   |         |         | 365/145 |
| 2012/0004713 | A2 | * | 1/2012 | Whitely | A61F 7/02 |
|           |    |   |         |         | 607/112 |
| 2017/0315737 | A1 | * | 11/2017 | Kajigaya | G06F 3/0616 |

* cited by examiner

*Primary Examiner* — Gene N Auduong
(74) *Attorney, Agent, or Firm* — Dorsey & Whitney LLP

(57) ABSTRACT

Apparatuses and methods are disclosed that include ferroelectric memory and for refreshing ferroelectric memory. An example apparatus includes: a word line; a first memory cell coupled to a first digit line and stores a first data on the first digit line responsive to the word line in an active state; a second memory cell coupled to a second digit line and stores a second data on the second digit line responsive to the word line in the active state. The first digit line is coupled to a first power potential and the second digit line is coupled to a second power potential in a refresh operation.

23 Claims, 10 Drawing Sheets

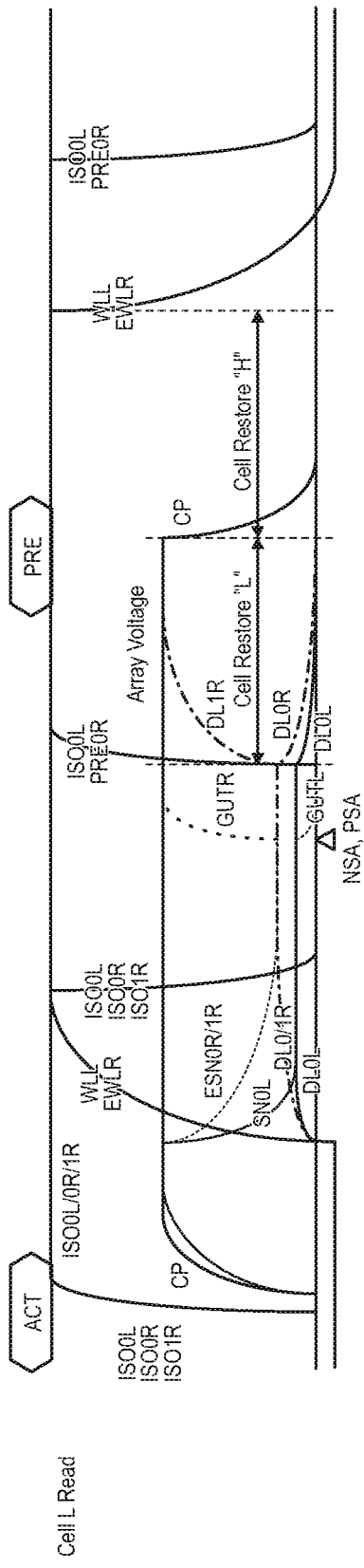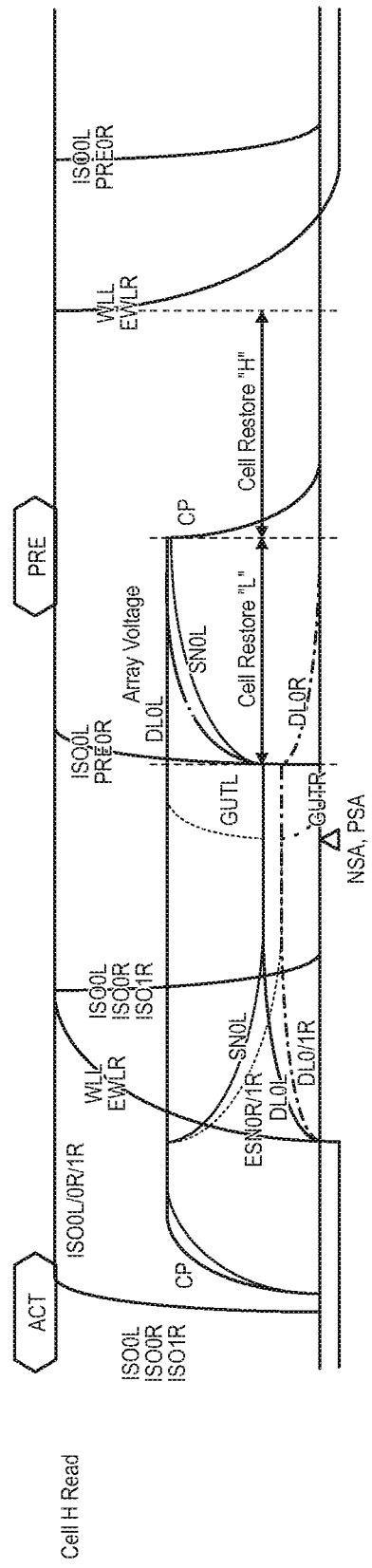

APPARATUSES AND METHODS FOR ACCESSING FERROELECTRIC MEMORY INCLUDING PROVIDING REFERENCE VOLTAGE LEVEL

BACKGROUND

Memory devices are widely used to store information in various electronic devices such as computers, wireless communication devices, cameras, digital displays, and the like. Information is stored by programing different states of a memory device. For example, binary devices have two states, often denoted by a logic "1" or a logic "0." In other systems, more than two states may be stored. To access the stored information, the electronic device may read, or sense, the stored state in the memory device. To store information, the electronic device may write, or program, the state in the memory device.

Various types of memory devices exist, including random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, and others. Memory devices may be volatile or non-volatile. Non-volatile memory, e.g., flash memory, can store data for extended periods of time even in the absence of an external power source. Volatile memory devices, e.g., DRAM, may lose their stored state over time unless they are periodically refreshed by an external power source. A binary memory device may, for example, include a charged or discharged capacitor. A charged capacitor may, however, become discharged over time through leakage currents, resulting in the loss of the stored information. Certain features of volatile memory may offer performance advantages, such as faster read or write speeds, while features of non-volatile memory, such as the ability to store data without periodic refreshing, may be advantageous.

FeRAM may use similar device architectures as volatile memory but may have non-volatile properties due to the use of a ferroelectric capacitor as a storage device. FeRAM devices may thus have improved performance compared to other non-volatile and volatile memory devices. It is desirable, however, to improve the operation of FeRAM devices. For example, it may be desirable to have improved self reference voltage level robust to temperature changes and individual die characteristics during memory cell sensing for operation of FeRAM devices.

BRIEF DESCRIPTION OF THE DRAWINGS

FIGS. 1B and 1C are timing diagrams of various signals during the read operation by the example circuit in FIG. 1A according to an embodiment of the disclosure.

DETAILED DESCRIPTION

Various embodiments of the present disclosure will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structure, logical and electrical changes may be made without departing from the scope of the present invention. The various embodiments disclosed herein are not necessary mutually exclusive, as some disclosed embodiments can be combined with one or more other disclosed embodiments to form new embodiments.

Figure 1A:
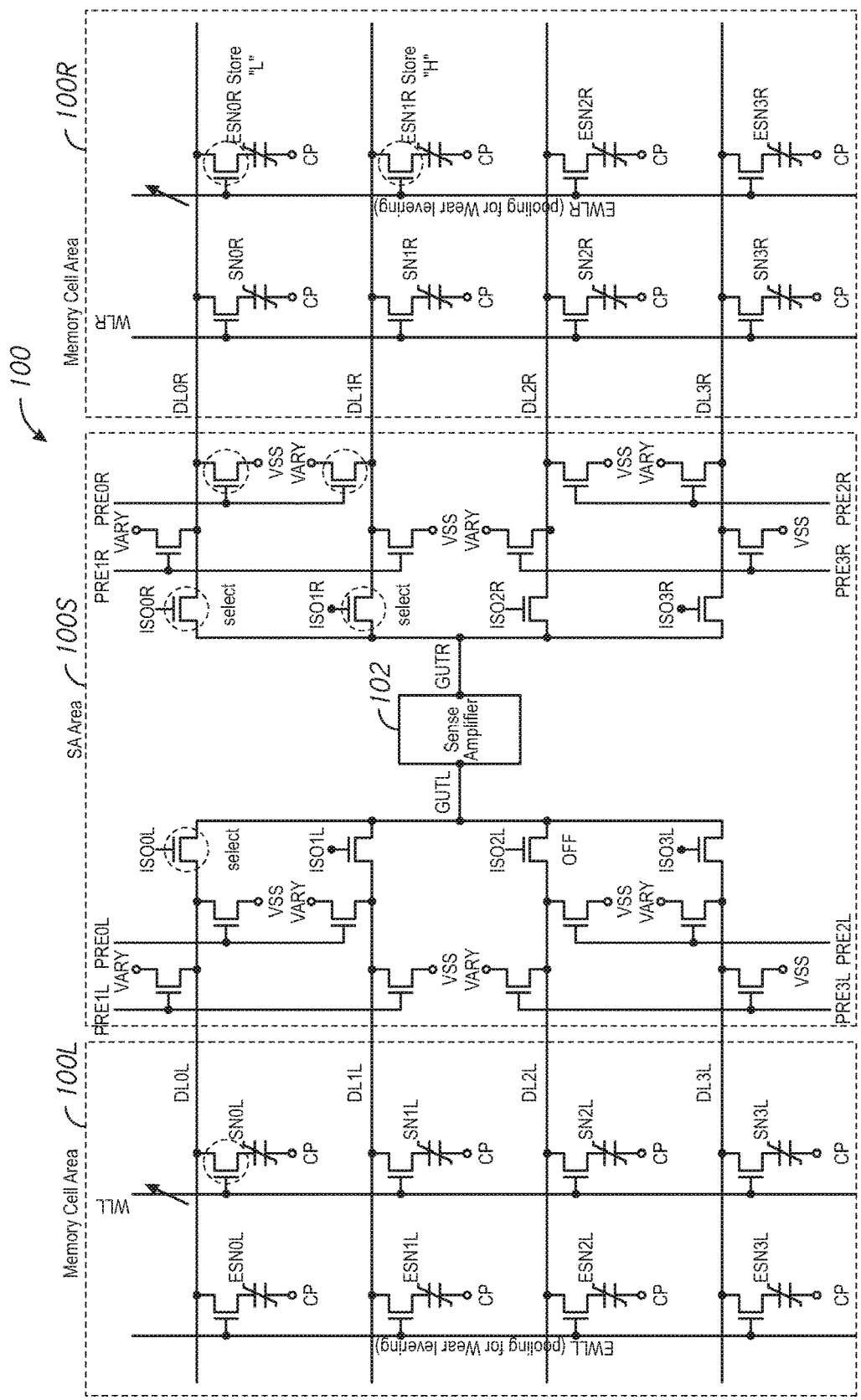
FIG. 1A is a schematic diagram of an example circuit including a column of memory cells and a sense amplifier during a read operation according to an embodiment of the present disclosure.

FIG. 1A is a schematic diagram of an example circuit 100 including a column of memory cells and a sense amplifier during a read operation according to an embodiment of the present disclosure. The circuit 100 may include memory cell areas 100L and 100R and a sense amplifier area 100S. For example, memory cells included in the memory cell areas 100L and 100R may be a FeRAM memory cells. For example, each FeRAM memory cell may include a transistor (e.g., an n-type field effect transistor) that may function as a switch, a capacitor, including ferroelectric material, that may store data and a cell plate (CP) node coupled to a shared plate line. For example, the memory cell area 100L includes a plurality of target memory cells SN0L, SN1L, SN2L and SN3L and a plurality of reference memory cells ESN0L, ESN1L, ESN2L and ESN3L. For example, the memory cell area 100L may further include a word line WLL and an extra word line EWLL for wear leveling. A "wear leveling" scheme is used to reduce degradation of nonvolatile memory cells due to repetitions of accesses to a certain cell by replacing the certain cell with a cell having a different address in a refresh period. The word line WLL may be coupled to the plurality of target memory cells SN0L, SN1L, SN2L and SN3L, and the extra word line EWLL may be coupled to the plurality of reference memory cells ESN0L, ESN1L, ESN2L and ESN3L. The memory cell area 100L may further include digit lines DL0L, DL1L, DL2L and DL3L coupled to SN0L and ESN0L, SN1L and ESN1L, SN2L and ESN2L, and SN3L and ESN3L, respectively. Similarly, the memory cell area 100R includes a plurality of target memory cells SN0R, SN1R, SN2R and SN3R and a plurality of reference memory cells ESN0R, ESN1R, ESN2R and ESN3R. For example, the memory cell area 100R may further include a word line WLR and an extra word line EWLR for wear leveling. The word line WLR may be coupled to the plurality of target memory cells SN0R, SN1R, SN2R and SN3R, and the word line EWLR may be coupled to the plurality of reference memory cells ESN0R, ESN1R, ESN2R and ESN3R. The memory cell area 100R may further include digit lines DL0R, DL1R, DL2R and DL3R coupled to SN0R and ESN0R, SN1R and ESN1R, SN2R and ESN2R, and SN3R and ESN3R, respectively. For example, the extra word lines EWLL and EWLR may be used for pooling a page cell data by copying an access page data to a destination address (e.g., pooling address).

The sense amplifier area 100S may include a sense amplifier 102 and various transistors to detect and amplify a difference in signals, which may include latching the amplified difference. For example, the various transistors may include a plurality of isolation switches ISO0L, ISO1L, ISO2L and ISO3L. Each of the plurality of isolation switches ISO0L, ISO1L. ISO2L and ISO3L has one node coupled a GUTL node of the sense amplifier 102 and another node coupled to the corresponding digit lines DL0L, DL1L, DL2L and DL3L, respectively, and selectively couple or decouple the corresponding digit line to the sense amplifier 102. For example, the various transistors may include a plurality of isolation switches ISO0R, ISO1R, ISO2R and ISO3R. Each of the plurality of isolation switches ISO0R, ISO1R, ISO2R and ISO3R has one node coupled a GUTR node of the sense amplifier 102 and another node coupled to the corresponding digit lines DL0R, DL1R, DL2R and DL3R, respectively, and selectively couple or decouple the corresponding digit line to the sense amplifier 102. The various transistors may also include power transistors, each power transistor coupled between a corresponding digit line and a power supply node (e.g., an array voltage (VARY) supply node or a ground potential (VSS) supply node). For example, a gate node of each power transistor may be coupled to one of control lines PRE1L, PRE0L, PRE1R and PRE0R in order to couple digit lines to either the array voltage (VARY) or the ground potential (VSS) for precharging responsive to a precharge (PRE) command.

FIGS. 1B and 1C are timing diagrams of various signals during the read operation by the example circuit in FIG. 1A according to an embodiment of the disclosure. For example, FIG. 1B represents when a target memory cell SN0L stores a data of a logic low level "L" and FIG. 1C represents when the target cell SN0L stores a data of a logic high level "H". For example, reference memory cells ESN0R and ESN1R may store data of a logic high level (e.g., "H", "1") and a logic low level (e.g., "L", "0"), respectively. In a reading operation from the target memory cell SN0L, the isolation switches ISO0L, ISO0R and ISO1R, as shown in circles with dotted lines, may be activated by increasing voltage levels of gate nodes of the isolation switches ISO0L, ISO0R and ISO1R to a logic high level (e.g., "H") to simultaneously access the target memory cell SN0L and the reference memory cells ESN0R and ESN1R responsive to an active (ACT) command. The digit line DL0L coupled to SN0L may be coupled to the GUTL node of the sense amplifier 102 and the digit lines DL0R and DL1R coupled to SN0R and SN1R may be coupled to the GUTR node of the sense amplifier 102. After activating the isolation switches ISO0L, ISO0R and ISO1R, a voltage of CP node commonly coupled to the shared plate line may be increased to an array voltage (VARY). Here, the reference memory cell ESN0R may store the logic low level "L" and the reference memory cell ESN1R may store the logic high level "H". After the voltage of CP node is increased, the target memory cell SN0L and the reference memory cells ESN0R and ESN1R may be accessed by activating (e.g., increasing voltage levels of) the word line WLL in the memory cell area 100L and the extended word line EWLR in the memory cell area 100R responsive to a read (READ) command. Responsive to the activation of the word line WLL and the extended word line EWLR, data of the target memory cell SN0L and the reference memory cells ESN0R and EN1R may be transferred to the digit lines DL0L, DL0R and DL1R, respectively. Thus, the activation of the extended word line EWLR may provide a digit line reference voltage level VDLREF that is in the middle (e.g., an average) of a logic high level and a logic low level of the target memory cell SN0L on the GUTR node of the sense amplifier 102, whereas the activation of the word line WLL may provide a voltage from the target memory cell SN0L on the GUTL node of the sense amplifier 102 for sensing. For example, in FIG. 1B when the target memory cell SN0L stores the data of the logic low level "L", a voltage level of the GUTL node coupled to the target memory cell SN0L through the digit line DL0L is lower than a voltage level of the GUTR node coupled to the digit lines DL0R and DL1R. On the other hand, in FIG. 1C when the target cell SN0L stores the data of the logic high level "H", the voltage level of the GUTL node coupled to the target memory cell SN0L through the digit line DL0L is higher than the voltage level of the GUTR node coupled to the digit lines DL0R and DL1R.

After transferring the data to the digit lines DL0L, DL0R and DL1R, the isolation switches ISO0L, ISO0R and ISO1R may be deactivated by decreasing the voltage levels of the gate nodes of the isolation switches ISO0L, ISO0R and ISO1R to a logic low level (e.g., "L") to simultaneously decouple the target memory cell SN0L and the reference memory cells ESN0R and ESN1R from the sense amplifier 102. The sense amplifier 102 may execute a sensing operation based on the voltage level of the GUTL node (e.g., the voltage level from the target memory cell SN0L) referring to the digit line reference voltage level VDLREF of the GUTR node. For instance, if the voltage of GUTL node has a voltage that is higher than the digit line reference voltage level VDLREF on the GUTB node, then the sense amplifier 102 may drive the GUTL node to a higher supply voltage (e.g., the array voltage VARY) and drive the GUTR node to the lower supply voltage (e.g., the ground potential VSS). The sense amplifier 102 may latch the state of the sense amplifier (e.g., voltages of the GUTL node and/or GUTR node), which may be used to determine the stored state and logic value of the target memory cell SN0L, e.g., "H". Alternatively, if the GUTL node has a lower voltage than the digit line reference voltage level VDLREF on the GUTR node, the sense amplifier 102 may drive the GUTL node to the lower supply voltage and drive the GUTR node to the higher supply voltage. The sense amplifier 102 may also latch the sense amplifier state for determining the stored state and the logic value of the target memory cell SN0L, e.g., "L". The stored state may represent a logic value of the target memory cell SN0L, which may then be provided, for example, through a column decoder (not shown) as data output.

Figure 2:
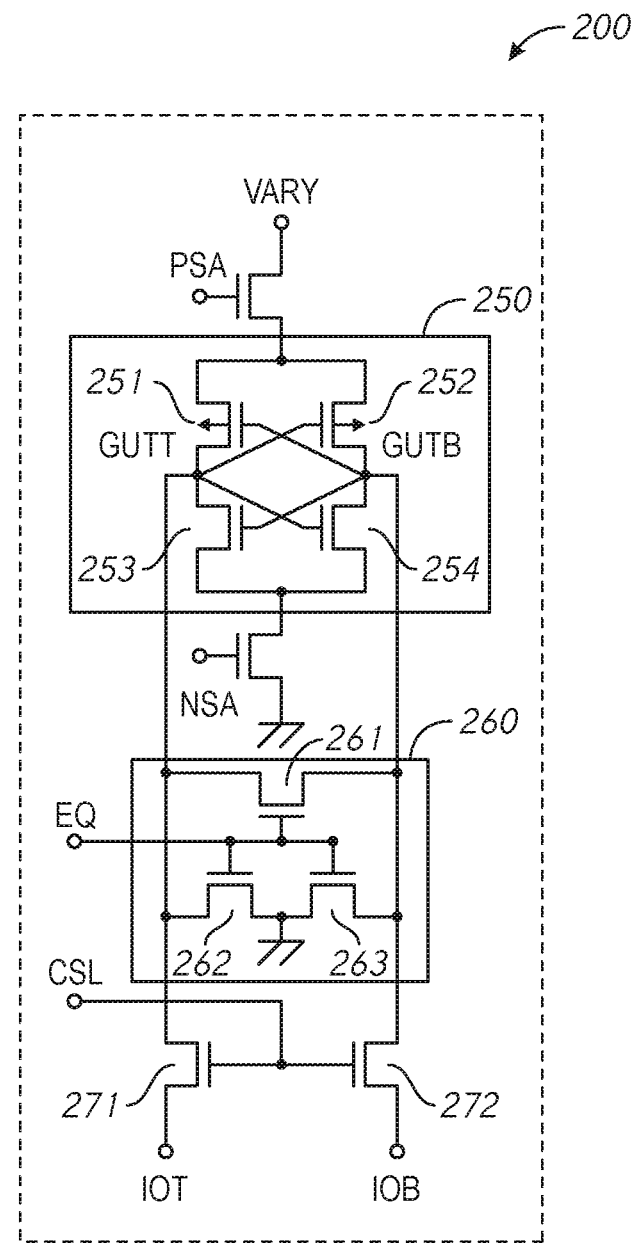
FIG. 2 is a schematic diagram of a sense amplifier according to an embodiment of the disclosure.

FIG. 2 is a schematic diagram of a sense amplifier circuit 200 according to an embodiment of the disclosure. For example, the sense amplifier circuit 200 may be included in the sense amplifier 102 in FIG. 1A. A GUTT node may be driven to a higher (e.g., a positive) or lower (e.g., negative or ground) supply voltage based on the comparison and a GUTB node may be driven to the complementary voltage (e.g., the positive supply voltage is complementary to the negative or ground voltage, and the negative or ground voltage is complementary to the positive supply voltage).

For example, in the sense amplifier circuit 200, the array voltage VARY may be provided as the higher supply voltage and the ground potential (VSS) may be provided as the lower supply voltage. For example, the GUTT node of the sense amplifier circuit 200 may be coupled to the GUTL node of the sense amplifier 102 and the GUTB node of the sense amplifier circuit 200 may be coupled to the GUTR node of the sense amplifier 102, or vice versa. For example, the sense amplifier circuit 200 may include a sensing circuit 250 and a voltage equalization circuit 260. The sensing circuit 250 may include p-type field effect transistors 251 and 252 and n-type field effect transistors 262 and 266. Gates of the transistor 251 and the transistor 253 are coupled to the GUTT node. Gates of the transistor 252 and the transistor 254 are coupled to the GUTB node. An n-type field effect transistor 210 is configured to be coupled to a higher supply voltage (e.g., the array voltage) and is coupled to a common node of the transistors 251 and 252. The transistor 210 is activated by an active PSA signal (e.g., active high logic). Another n-type field effect transistor 220 is configured to be coupled to a lower supply voltage (e.g., the ground potential VSS) and is coupled to a common node of the transistors 253 and 254. The transistor 220 is activated by an active NSA signal (e.g., active high logic). A reference signal (e.g., the digit line reference voltage level VDLREF) is provided to the GUTB node. The voltage equalization circuit 260 may receive an equalization signal EQ (e.g., active high logic) that is active in a precharge operation. Responsive to the equalization signal EQ, an n-type field effect transistor 261 may couple the GUTT node and the GUTB node, n-type field effect transistors 262 and 263 may couple the GUTT node and the GUTB node to the lower supply voltage (e.g., the ground potential), respectively. The sense amplifier 200 may also include n-type field effect transistors 271 and 272. Gates of the transistor 271 and the transistor 272 may commonly receive a column select line signal CSL. The transistor 271 and the transistor 272 may couple the GUTT and GUTB nodes to a pair of complementary bit read lines IOT and IOB respectively responsive to the active column select line signal CSL. The pair of complementary bit read lines IOT and IOB transmit the voltages on the GUTT and GUTB nodes to the column decoder (not shown) respectively. Thus, responsive to activation of the transistors 210 and 220 receiving active PSA and NSA signals in the sense amplifier circuit 200 in the sense amplifier 102, the GUTL and GUTR nodes in the sense amplifier may be amplified. For example, in FIG. 1B when the target memory cell SN0L stores "L" level, the voltage of the GUTL node may be decreased to the ground potential and the voltage of the GUTR node may be amplified to the array voltage (VARY) that may be transmitted to the column decoder via the pair of complementary bit read lines IOT and IOB. As in FIG. 1C when the target memory cell SN0L stores "H" level, the voltage of the GUTL node may be amplified to the array voltage (VARY) and the voltage of the GUTR node may be decreased to the ground potential that may be transmitted to the column decoder via the pair of complementary bit read lines IOT and IOB Responsive the precharge operation, the isolation switches ISO0L may be activated. Responsive to the activated isolation switch ISO0L, the amplified data on the GUTL node may be restored to the target memory cell SN0L. For example, in FIG. 1B, the target memory cell SN0L may be coupled to the digit line DL0L at the ground potential. On the other hand, in FIG. 1C, the target memory cell SN0L may be coupled to the digit line DL0L at the array voltage VARY. In the precharge operation, a precharge signal PRE0R may be active. Responsive to the active precharge signal PRE0R (e.g., active logic high), the reference memory cells ESN0R and ESN1R may be restored. For example, the active precharge signal PRE0R may couple the digit line DL0R to the ground potential VSS and the digit line DL1R to the array voltage VARY, respectively. After restoring the memory cells with "L" level, the voltage of CP node commonly coupled to the shared plate line may be decreased to the ground potential and the memory cells with "H" level is restored. After the decrease of the voltage of CP node, the word lines WLL, EWLR is deactivated (e.g., a logic low level) and the isolation switch ISO0L and the precharge signal PRE0R may be deactivated (e.g., a logic level low).

Figure 3A:
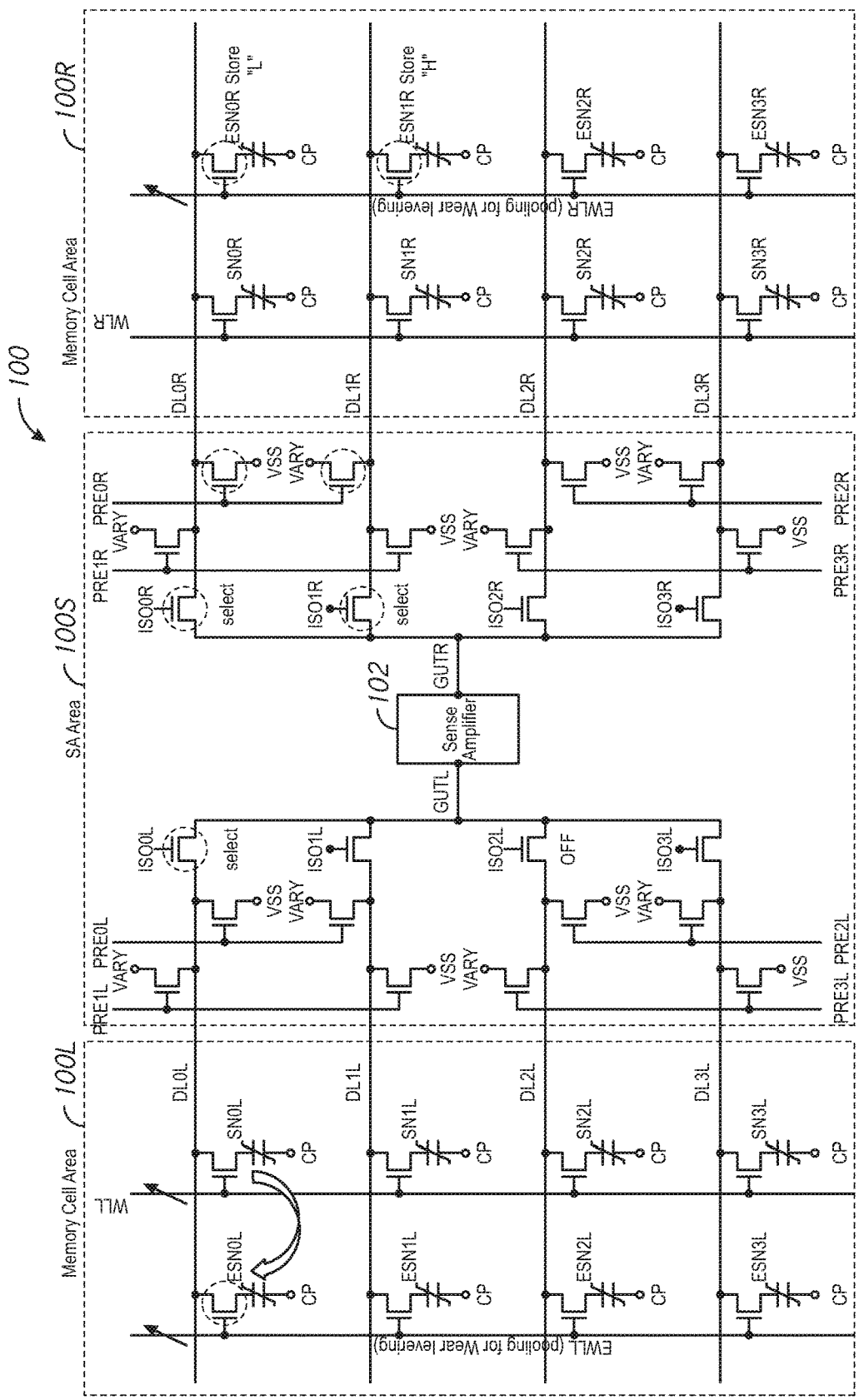
FIG. 3A is a schematic diagram of the example circuit including the column of memory cells and the sense amplifier during a refresh operation in one digit line according to an embodiment of the present disclosure.
Figure 3B:
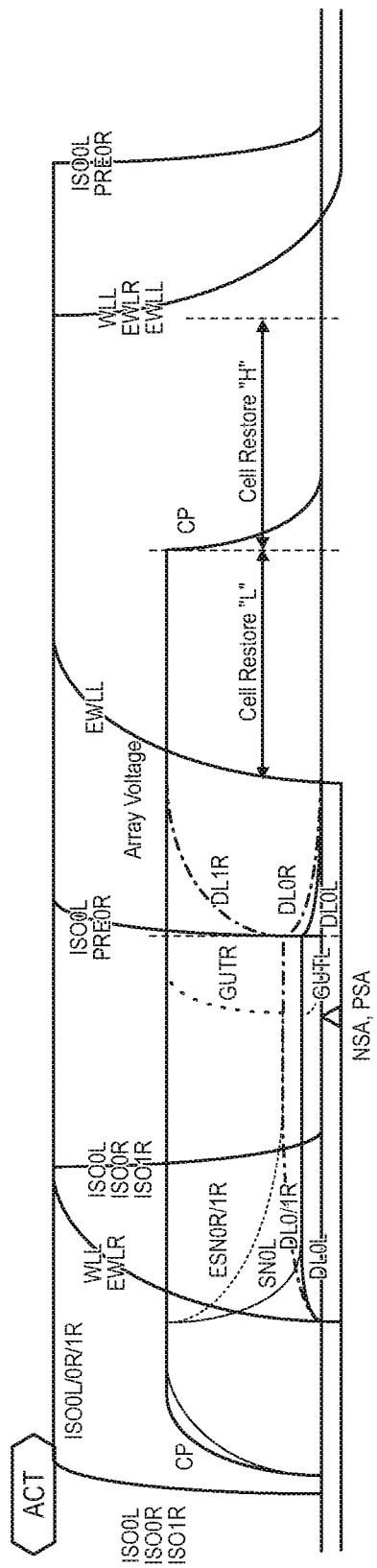
FIGS. 3B and 3C are timing diagrams of various signals during the refresh operation by the example circuit in FIG. 3A according to an embodiment of the disclosure.
Figure 3C:
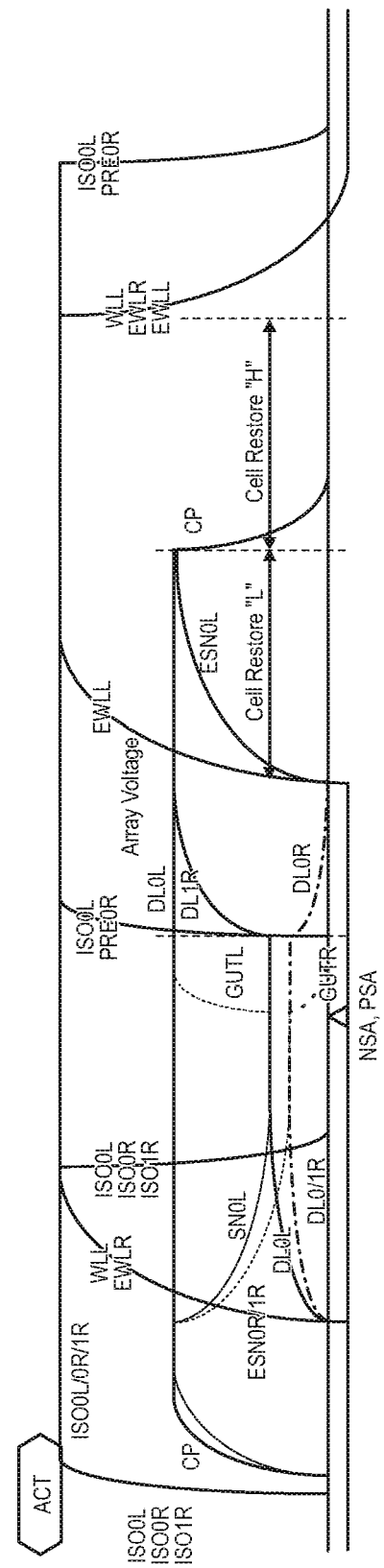

FIG. 3A is a schematic diagram of the example circuit 100 including the column of memory cells and the sense amplifier during a refresh operation in one digit line according to an embodiment of the present disclosure. Description of components corresponding to components included in FIG. 1A will not be repeated and changes from FIG. 1A including indication of additional reference memory cell ESN0L will be described. FIGS. 3B and 3C are timing diagrams of various signals during the refresh operation by the example circuit 100 in FIG. 3A according to an embodiment of the disclosure. Description of behaviors of signals of the components responsive to an active (ACT) command until receiving active PSA and NSA signals is also included in description referring to FIG. 1A and will not be repeated. Unlike receiving the precharge (PRE) command in the read operation, the refresh operation may be executed with a "wear levering scheme" by replacing copying data on a target memory cell to another address in a refresh period. For example, the wear levering scheme may use an extra word line (e.g., an extra word line EWLL of the same sense amplifier (SA) area 100S) for pooling the data of the target memory cells (SN0L to SN3L, SN0R to SN3R) to the corresponding reference memory cells (e.g. ESN0L to ESN3L, ESN1R to ESN3R) of destination addresses (e.g. pooling addresses) coupled to the extra word line (e.g., EWLL).

Figure 5:
FIG. 5 is a timing diagram of various signals during refresh operations by the example circuit according to an embodiment of the disclosure.

When signals on the GUTL node and GUTR nodes of the sense amplifier 102 are amplified, the isolation switch ISO0L and the precharge signal PRE0R may be activated. Responsive to the active precharge signal PRE0R (e.g., active logic high), the reference memory cells ESN0R and ESN1R may be restored. For example, the active precharge signal PRE0R may couple the digit line DL0R to the ground potential VSS and the digit line DLR to the array voltage VARY, respectively. Simultaneously, responsive to the activated isolation switch ISO0L, the amplified data on the GUTL node may be restored to the target memory cell (e.g., SN0L). A pooling address (e.g. a destination address) for a corresponding reference memory cell ESN0L for the target memory cell SN0L may also be selected and the extra word line (e.g., EWLL) may be activated after the activation of the isolation switch ISO0L. Thus, the data signal amplified in the sense amplifier 102 may be provided to the corresponding reference memory cell ESN0L via the digit line DL0L and the data may be saved in the corresponding reference memory cell ESN0L. For example, the data of the target memory cell SN0L is saved in the reference memory cell ESN0L responsive to the activation of the extra word line EWLL. For example, as shown in FIG. 3B, a signal level of the reference memory cell ESN0L may stay at a logic low level if the data signal of the target memory cell SN0L is at "L" level. As shown in FIG. 3C, the signal level of the reference memory cell ESN0L may be increased to a logic high "H" level (e.g., the array voltage VARY) if the data signal of the target memory cell SN0L is at the "H" level. After restoring the memory cells with "L" level, the voltage of CP node commonly coupled to the shared plate line may be decreased to the ground potential and the memory cells with "H" level is restored. After the decrease of the voltage of CP node, the word lines WLL, EWLR may be deactivated (e.g., a logic low level) and the isolation switch ISO0L and the precharge signal PRE0R may be deactivated (e.g., a logic level low). FIG. 5 is a timing diagram of various signals during refresh operations by the example circuit 100 according to an embodiment of the disclosure. For example, the refresh operation is executed on eight memory cells in an order of SN0L, SN1L, SN0R, SN1R, SN2L, SN3L, SN2R and SN3R.

In a first half refresh period of the memory cell SN0L, the word line WLL and the isolation switch ISO0L are activated and a data D0L stored on the memory cell SN0L is provided on the digit line DL0L. The isolation switches ISO2R, ISO3R and the extra word line EWLR may be activated in the first half refresh period of the memory cell SN0L and the reference memory cells ESN2R and ESN3R may provide stored reference levels "L(0)" and "H(1)" through the digit lines DL2R and DL3R, respectively, to provide a digit line reference voltage level VDLREF to the GUTR node. In a second half refresh period of the memory cell SN0L, the extra word line EWLL may be activated to store the data D0L on the digit lines DL0L to the reference memory cell ESN0L. The precharge signal PRE2R may be activated in the second half refresh period of the memory cell SN0L and restore the reference levels "L(0)" and "H(1)" through the digit lines DL2R and DL3R, respectively to the reference memory cells ESN2R and ESN3R. Thus, the data D0L in the memory cell SN0L is stored in the reference memory cell ESN0L. After the refresh period of the memory cell SN0L, if memory access to the memory cells in the memory cell area 100R is executed, the reference memory cells ESN2L and ESN3L may provide the digit line reference voltage level VDLREF because the SN1L still stores the data D1L. Next, in the refresh period of the memory cell SN1L, a data D1L in stored on the memory cell SN1L is saved on the reference memory cell ESN1L, similarly to the refresh of the memory cell SN0L.

In a first half refresh period of the memory cell SN0R, the word line WLR and the isolation switch ISO0R are activated and a data D0R stored on the memory cell SN0R is provided on the digit line DL0R. The isolation switches ISO2L, ISO3L and the extra word line EWLL may be activated in the first half refresh period of the memory cell SN0R and the reference memory cells ESN2L and ESN3L may provide stored reference levels "L(0)" and "H(1)" through the digit lines DL2L and DL3L, respectively, to provide a digit line reference voltage level VDLREF to the GUTL node. In a second half refresh period of the memory cell SN0R the extra word line EWLR may be activated to store the data D0R on the digit lines DL0R to the reference memory cell ESN0R. The precharge signal PRE2L may be activated in the second half refresh period of the memory cell SN0R and restore the reference levels "L(0)" and "H(1)" through the digit lines DL2L and DL3L, respectively to the reference memory cells ESN2L and ESN3L. Thus, the data D0R in the memory cell SN0R is stored in the reference memory cell ESN0R. After the refresh period of the memory cell SN0R, if memory access to the memory cells in the memory cell area 100L is executed, the reference memory cells ESN2R and ESN3R may provide the digit line reference voltage level VDLREF because the SN1R still stores the data D1R.

Next, in the refresh period of the memory cell SN1R, a data D1R in stored on the memory cell SN1R is saved on the reference memory cell ESN1R, similarly to the refresh of the memory cell SN0R.

Figure 4A:
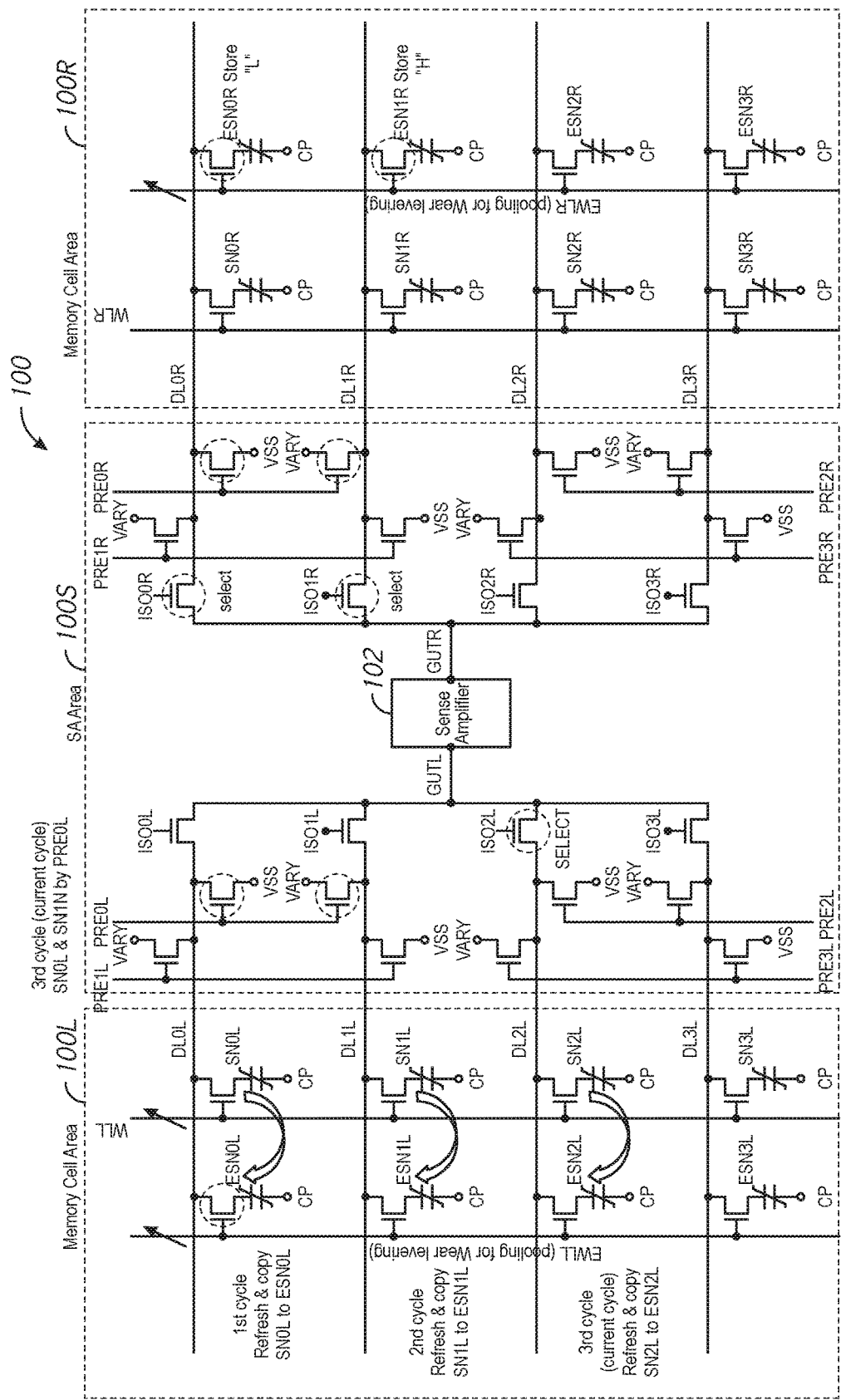
FIG. 4A is a schematic diagram of the example circuit including the column of memory cells and the sense amplifier during a refresh operation in one digit line according to an embodiment of the present disclosure.
Figure 4B:
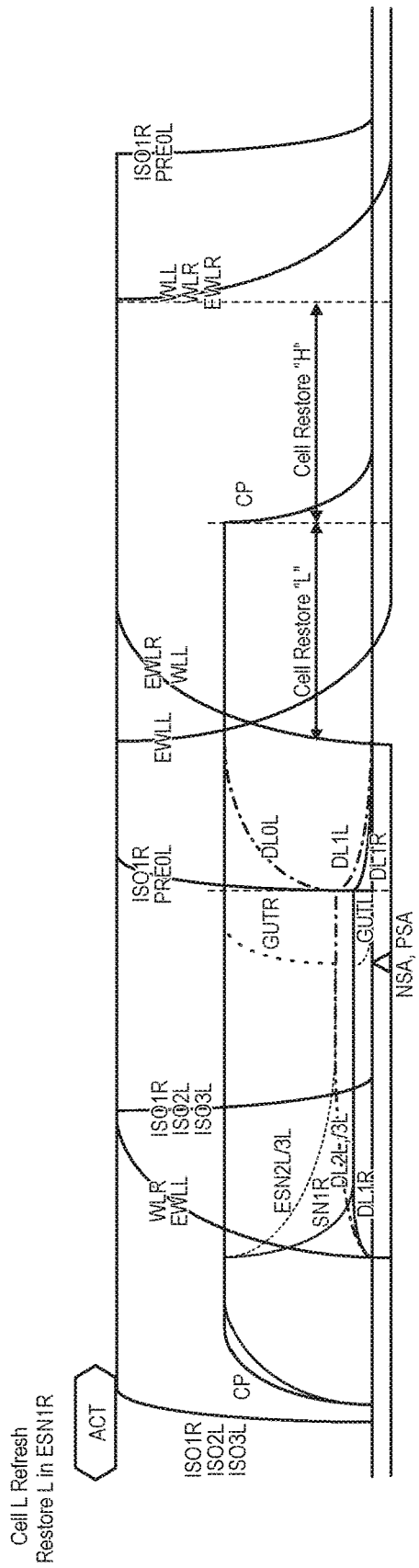
FIGS. 4B and 4C are timing diagrams of various signals during the refresh operation by the example circuit in FIG. 4A according to an embodiment of the disclosure.
Figure 4C:
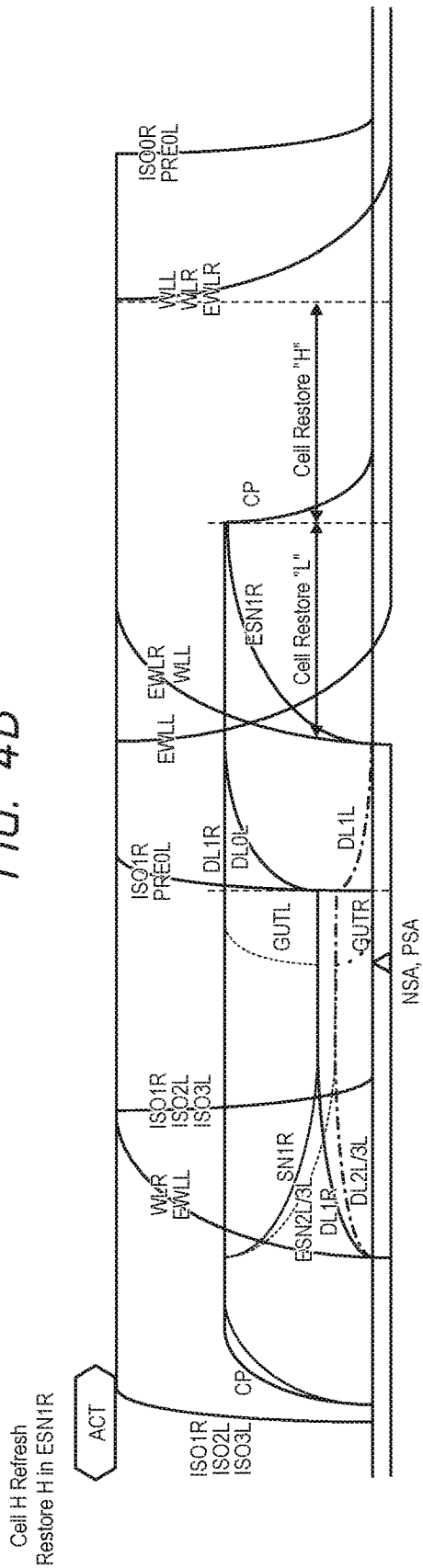

Next, in the refresh period of the memory cell SN1R, a data D1R in stored on the memory cell SN1R is saved on the reference memory cell ESN1R, similarly to the refresh of the memory cell SN0R. FIG. 4A is a schematic diagram of the example circuit 100 including the column of memory cells and the sense amplifier during a refresh operation in one digit line according to an embodiment of the present disclosure. Description of components corresponding to components included in FIGS. 1A and 3A will not be repeated and changes from FIGS. 1A and 3A including indication of additional reference memory cell ESN0L will be described. FIGS. 4B and 4C are timing diagrams of various signals during the refresh operation by the example circuit 100 in FIG. 4A according to an embodiment of the disclosure.

Description of behaviors of signals of the components responsive to an active (ACT) command until receiving active PSA and NSA signals is similar, except for the target cell being SN1R responsive to an activation of the isolation switch ISO1R, instead of SN0L responsive to the activation of the isolation switch ISO0L in description referring to FIG. 1A and will not be repeated. Unlike receiving the precharge (PRE) command in the read operation, the refresh operation may be executed with a "wear levering scheme" by replacing copying data on a target memory cell to another address in a refresh period. After storing data for pooling in the reference memory cells in the wear levering scheme, there may be no pair of reference memory cells available for storing reference logic levels "L" and "H" for providing the digit line reference voltage level VDLREF.

For example, when signals on the GUTL node and GUTR nodes of the sense amplifier 102 are amplified, the isolation switch ISO1R and the precharge signal PRE0L may be activated. Responsive to the activated isolation switch ISO1R, the amplified data on the GUTR node may be restored to the target memory cell (e.g., SN1R) via the digit line DL1R in a data mode. For example, the voltage of DL1R may be decreased to the ground potential (VSS) in FIG. 4B and may be increased to the array voltage (VARY) in FIG. 4C. A pooling address (e.g. a destination address) for a corresponding reference memory cell (e.g., ESN1R) for the target memory cell (e.g., SN2L) may also be selected and the extra word line (e.g., EWLR) may be activated after the activation of the isolation switch ISO1R. For example, the data of the target memory cell SN1R is saved in the reference memory cell ESN1R in a pooling mode responsive to the activation of the extra word line EWLR. Thus, the data signal amplified in the sense amplifier 102 may be provided to the corresponding reference memory cell ESN1R via the digit line DL1R and the data may be saved in the corresponding reference memory cell ESN1R. For example, as shown in FIG. 4B, a signal level of the reference memory cell ESN1R may stay at a logic low level if the data signal of the target memory cell SN1R is at "L" level. As shown in FIG. 4C, the signal level of the reference memory cell ESN1R may be increased to a logic high "H" level (e.g., the array voltage VARY) if the data signal of the target memory cell SN1R is at the "H" level. After restoring the memory cells with "L" level, the voltage of CP node commonly coupled to the shared plate line may be decreased to the ground potential and the memory cells with "H" level is restored. After the decrease of the voltage of CP node, the word lines WLL, WLR and EWLR may be deactivated (e.g., a logic low level) and the isolation switch ISO1R and the precharge signal PRE0R may be deactivated (e.g., a logic level low).

As shown in FIGS. 4B and 4C, while storing the data D1R, data on the reference memory cells ESN2L and ESN3L may be destroyed by the decrease in voltage level, responsive to the activation of isolation switches ISO2L and ISO3L in the first half of the refresh period of the memory cell SN1R, and new reference data may be written to the memory cells SN0L and SN1L. For example, in the second half of the refresh period of the memory cell SN1R, the word line WLL and the precharge signal PRE0L may be activated. Responsive to the active precharge signal PRE0L (e.g., active logic high), the reference memory cells SN0L and SN1L may be restored. For example, the active precharge signal PRE0L may couple the digit line DL0L to the ground potential VSS and the digit line DL1L to the array voltage VARY, respectively. The reference levels "L(0)" and "H(1)" through the digit lines DL0L and DL1L may be stored, respectively to the memory cells SN0L and SN1L. Thus, the digit line reference voltage level VDLREF may be provided by the target memory cells SN0L and the SN1L storing the "L" and "H" level in a reference mode, unlike the target memory cells SN0L and the SN1L storing data in a data mode as shown in FIGS. 1A and 3A.

In a first half refresh period of the memory cell SN2L, the word line WLL and the isolation switch ISO2L are activated and a data D2L stored on the memory cell SN2L is provided on the digit line DL2L. The isolation switches ISO2R, ISO3R and the extra word line EWLR may be activated in the first half refresh period of the memory cell SN2L and the reference memory cells ESN2R and ESN3R may provide stored reference levels "L(0)" and "H(1)" through the digit lines DL2R and DL3R, respectively, to provide a digit line reference voltage level VDLREF to the GUTR node. In a second half refresh period of the memory cell SN2L, the extra word line EWLL may be activated to store the data D2L on the digit lines DL2L to the reference memory cell ESN2L. The precharge signal PRE2R may be activated in the second half refresh period of the memory cell SN2L and restore the reference levels "L(0)" and "H(1)" through the digit lines DL2R and DL3R, respectively to the reference memory cells ESN2R and ESN3R. Thus, the data D2L in the memory cell SN2L is stored in the reference memory cell ESN2L. After the refresh period of the memory cell SN2L, if memory access to the memory cells in the memory cell area 100R is executed, the memory cells SN0L and SN1L may provide the digit line reference voltage level VDLREF because the memory cell SN2L may still store the data D2L. Next, in the refresh period of the memory cell SN3L, a data D3L in stored on the memory cell SN3L is saved on the reference memory cell ESN3L, similarly to the refresh of the memory cell SN2L.

In a first half refresh period of the memory cell SN2R, the word line WLR and the isolation switch ISO2R are activated and a data D2R stored on the memory cell SN2R is provided on the digit line DL2R. The isolation switches ISO0L, ISO1L and the extra word line WLL may be activated in the first half refresh period of the memory cell SN2R and the memory cells SN0L and SN1L may provide stored reference levels "L(0)" and "H(1)" through the digit lines DL0L and DL1L, respectively, to provide a digit line reference voltage level VDLREF to the GUTL node. In a second half refresh period of the memory cell SN2R, the extra word line EWLR may be activated to store the data D2R on the digit lines DL2R to the reference memory cell ESN2R. The precharge signal PRE0L may be activated in the second half refresh period of the memory cell SN2R and restore the reference levels "L(0)" and "H(1)" through the digit lines DL0L and DL1L, respectively to the memory cells SN0L and SN1L. Thus, the data D2R in the memory cell SN2R is stored in the reference memory cell ESN2R. After the refresh period of the memory cell SN2R, if memory access to the memory cells in the memory cell area 100L is executed, the memory cells SN0R and SN1R may provide the digit line reference voltage level VDLREF because the ESN1R still stores the data D1R. Next, in the refresh period of the memory cell SN3R, a data D3R in stored on the memory cell SN3R is saved on the reference memory cell ESN3R, similarly to the refresh of the memory cell SN3R. Thus, reference voltage levels are transferred from reference memory cells, ESN2L, ESN3L, ESN2R, ESN3R to memory cells SN0L, SN1L, SN0R, SN1R.

Figure 6:
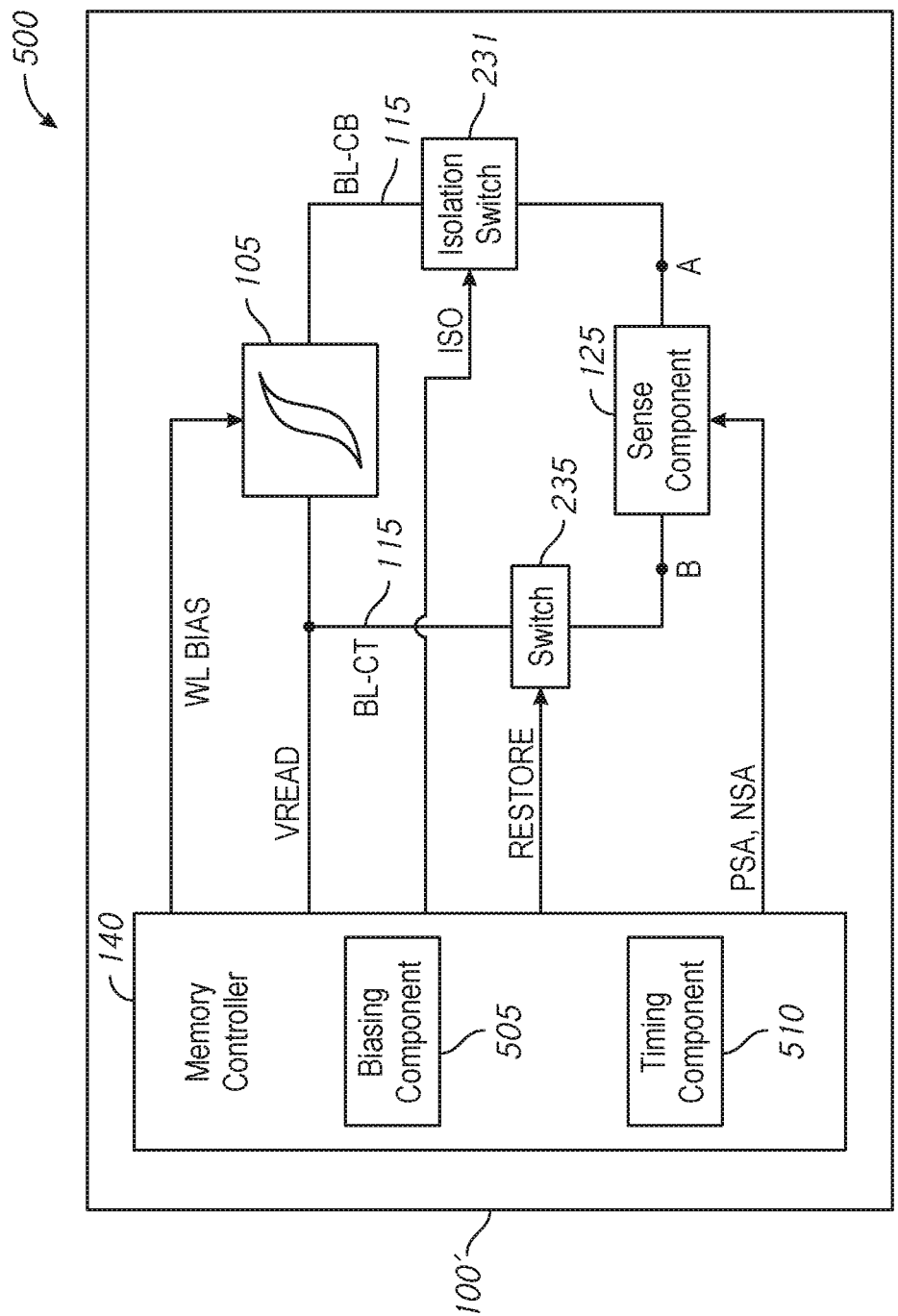
FIG. 6 is a block diagram of a memory array that supports a ferroelectric memory in accordance with various embodiments of the present disclosure.

FIG. 6 is a block diagram of a memory device 500 including a memory array 100' that supports a ferroelectric memory in accordance with various embodiments of the present disclosure. The memory array 100' may be the example circuit 100 referred to as an electronic memory apparatus and includes memory controller 140 and a plurality of memory cells 105. For example, the plurality of memory cells 105 may include the plurality of target memory cells and the reference memory cells in the memory cell areas 100L and 100R in FIGS. 1A, 3A and 4A. For example, a plurality of isolation switches 231 may include isolation switches ISO0L, ISO1L, ISO2L and ISO3L and ISO0R, ISO1R, ISO2R and ISO3R. A sense component 125 may include the sense amplifier 102 in FIGS. 1A, 3A and 4A.

The memory controller 140 may include biasing component 505 and timing component 510, and may operate memory device 500 as described in FIG. 1. The memory controller 140 may be in electronic communication with word lines WLL, WLR, EWLL and EWLR, digit lines 115 including BL-CT (e.g., DL0L, DL1L, DL2L, DL3L) and BT-CB (e.g., DL0R, DL1R, DL2R and DL3R), and sense component 125 including the sense amplifier 102 described with reference to FIGS. 1A, 3A and 4A. The memory controller 140 may also be in electronic communication with the plurality of isolation switch 231 and a plurality of switches 235.

The memory controller 140 may be configured to activate the word lines WLL, WLR, EWLL and EWLR or digit lines 115 by applying voltages to the word and digit lines. For example, biasing component 505 may be configured to apply a voltage to operate the memory cells 105 to read or write the memory cells 105 as described above. In some cases, the memory controller 140 may include a row decoder, a column decoder, or both, and the memory controller 140 may be configured activate the word lines and the bit lines responsive to decode results of the row decoder and the column decoder, respectively. This may enable the memory controller 140 to access one or more memory cells 105. A biasing component 505 may provide voltage potentials for the operation of the sense component 125. The biasing component 505 may include, for example, a driver circuit configured to provide the array voltage to some digit lines when activated, and/or the driver circuit may be configured to drive the other digit lines to the ground potential when activated.

The memory controller 140 may activate isolation switch 231 based on receiving an access operation request for the ferroelectric memory cell 105—that is, the memory controller 140 may electrically couple the memory cell 105 to the sense component 125 as described the above. The memory controller 140 may further determine a logic state of the ferroelectric memory cell 105 based on the active sense component 125, and write the logic state of the ferroelectric memory cell 105 back to the ferroelectric memory cell 105.

In some cases, the memory controller 140 may perform its operations using a timing component 510. For example, the timing component 510 may control the timing of the various word line selections or cell top biasing, including timing for switching and voltage application to perform the memory functions, such as reading and refreshing, discussed herein. In some cases, the timing component 510 may control the operations of the biasing component 505. For example, the memory controller 140 may control the biasing component 505 to provide the array voltage VARY to the digit line BL-CT to change the voltage of the memory cell, the digit line BL-CB, and sense node A of sense component 125. The memory controller 140 may then control the biasing component 505 to drive the digit line BL-CB to ground to change the voltage of the memory cell, the digit line BL-CT, and sense node B. Following the digit line BL-CB being driven to ground, the memory controller 140 may control the sensing component 125 to compare the voltage of sense node B to the voltage of sense node A, which is at a self-provided reference voltage.

The sense component 125 may compare a signal from memory cell 105 (through digit line 115) with a reference voltage. As previously discussed, in some embodiments the reference voltage may be self-provided, for example, using as a reference voltage of a sense node resulting from a pair of memory cells of the memory cell 105. Upon determining and amplifying the voltage difference, the sense component 125 may latch the state, where it may be used in accordance with the operations of an electronic device that memory array 100' is a part.

Figure 7:
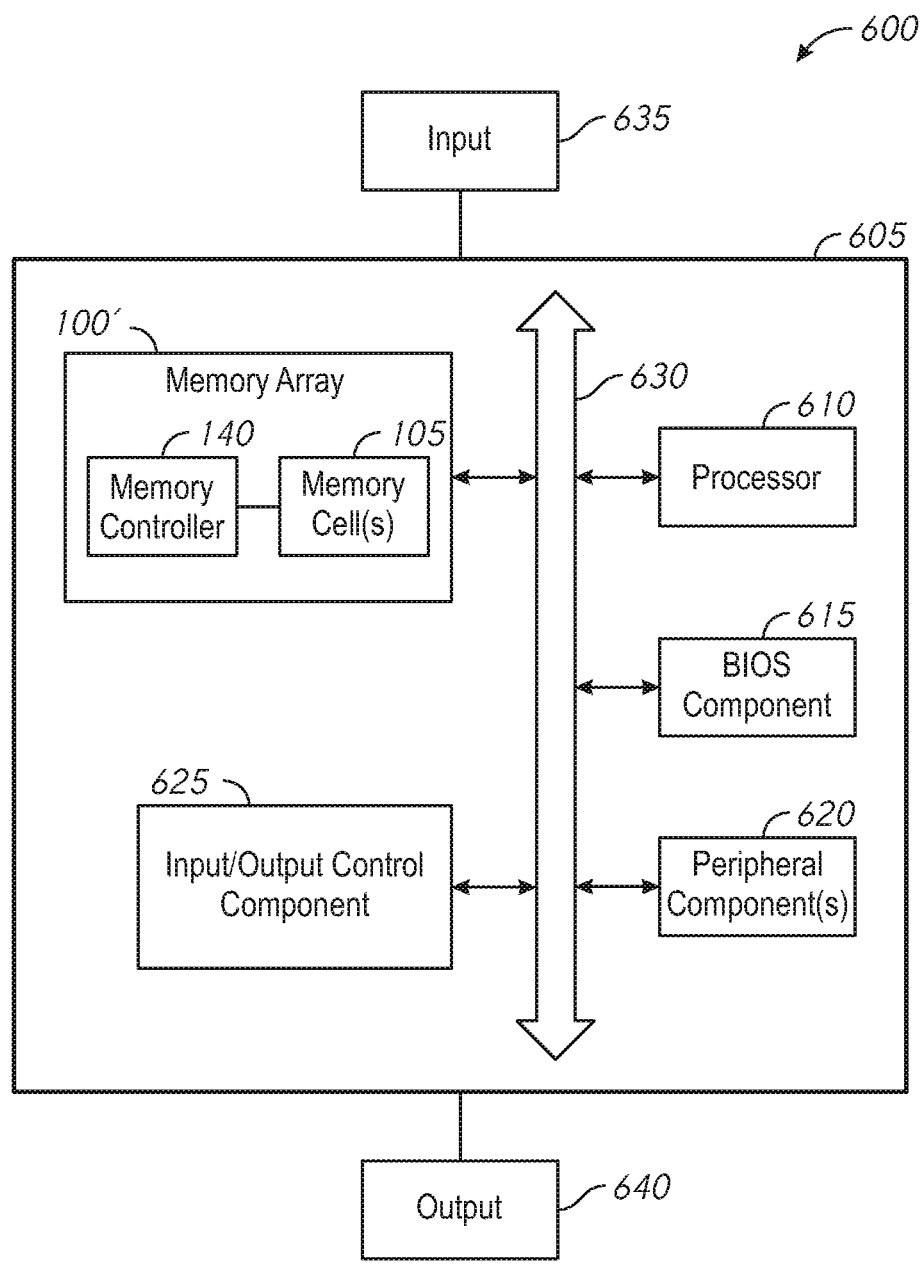
FIG. 7 is a block diagram of a system that supports a ferroelectric memory in accordance with various embodiments of the present disclosure.

FIG. 7 is a block diagram of a system 600 that supports a ferroelectric memory in accordance with various embodiments of the present disclosure. The system 600 includes a device 605, which may be or include a printed circuit board to connect or physically support various components. The device 605 may be a computer, notebook computer, laptop, tablet computer, mobile phone, or the like. The device 605 may include the memory array 100', which may be an example circuit 100 as described with reference to FIGS. 1A, 3A, 4A and 5. The memory array 100' may contain the memory controller 140 and the plurality of memory cells 105, which may be examples of memory controller 140 described with reference to FIG. 5 and the plurality of memory cells 105 described with reference to FIGS. 1A, 3A, 4A and 5. The device 605 may also include a processor 610, BIOS component 615, peripheral component(s) 620, and input/output control component 625. The components of device 605 may be in electronic communication with one another through bus 630.

The processor 610 may be configured to operate the memory array 100' through the memory controller 140. In some cases, the processor 610 may perform the functions of the memory controller 140 described with reference to FIG. 5. In other cases, the memory controller 140 may be integrated into the processor 610. The processor 610 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components. The processor 610 may perform various functions and operate the memory array 100' as described herein. The processor 610 may, for example, be configured to execute computer-readable instructions stored in the memory array 100' to cause the device 605 perform various functions or tasks.

The BIOS component 615 may be a software component that includes a basic input/output system (BIOS) operated as firmware, which may initialize and run various hardware components of the system 600. The BIOS component 615 may also manage data flow between the processor 610 and the various components, e.g., the peripheral components 620, the input/output control component 625, etc. The BIOS component 615 may include a program or software stored in read-only memory (ROM), flash memory, or any other non-volatile memory.

The peripheral component(s) 620 may be any input or output device, or an interface for such devices, that is integrated into the device 605. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots.

The input/output control component 625 may manage data communication between the processor 610 and the peripheral component(s) 620, the input devices 635, or the output devices 640. The input/output control component 625 may also manage peripherals not integrated into the device 605. In some cases, the input/output control component 625 may represent a physical connection or port to the external peripheral.

The input 635 may represent a device or signal external to the device 605 that provides input to the device 605 or its components. This may include a user interface or interface with or between other devices. In some cases, the input 635 may be a peripheral that interfaces with the device 605 via the peripheral component(s) 620 or may be managed by the input/output control component 625.

The output 640 may represent a device or signal external to the device 605 configured to receive output from the device 605 or any of its components. Examples of the output 640 may include a display, audio speakers, a printing device, another processor or printed circuit board, etc. In some cases, the output 640 may be a peripheral that interfaces with the device 605 via the peripheral component(s) 620 or may be managed by the input/output control component 625.

The components of the memory controller 140, the device 605, and the memory array 100' may be made up of circuitry designed to carry out their functions. This may include various circuit elements, for example, conductive lines, transistors, capacitors, inductors, resistors, amplifiers, or other active or inactive elements, configured to carry out the functions described herein.

From the foregoing it will be appreciated that, although specific embodiments of the disclosure have been described herein for purposes of illustration, various modifications may be made without deviating from the spirit and scope of the disclosure. Accordingly, the disclosure is not limited except as by the appended claims.

What is claimed is:

1. An apparatus comprising:
   a word line;
   a first memory cell coupled to a first digit line and configured to store a first data on the first digit line responsive to the word line in an active state;
   a second memory cell coupled to a second digit line and configured to store a second data on the second digit line responsive to the word line in the active state; and a sense amplifier comprising a first sensing node and a second sensing node, wherein the first digit line is coupled to a first power potential and the second digit line is coupled to a second power potential in a refresh operation, and wherein the first sensing node is coupled to the first digit line and the second digit line and the sense amplifier is configured to sense a voltage of the second sensing node when the first memory cell and the second memory cell are in a reference mode.

2. The apparatus of claim 1, wherein the first sensing node is coupled to the first digit line and the sense amplifier is configured to sense a voltage of the first digit line when the first memory cell is in a data mode.

3. The apparatus of claim 1, further comprising:

a second word line that is different from a first word line that is the word line; and a third memory cell coupled to the first digit line and configured to store the first data on the first digit line responsive to the second word line in an active state, wherein the second word line is in an active state simultaneously with the first word line.

4. A method comprising:

storing a first data on a first digit line in a first memory cell that is coupled to the first digit line responsive to a first word line in an active state;

storing a second data on a second digit line in a second memory cell that is coupled to the second digit line responsive to the first word line in the active state;

coupling the first digit line and the second digit line to the first sensing node when the first memory cell and the second memory cell are in a reference mode; and sensing a voltage of a second sensing node of the sense amplifier when the first memory cell and the second memory cell are in the reference mode, wherein the first digit line is coupled to a first power potential and the second digit line is coupled to a second power potential in a refresh operation.

5. The method of claim 4, further comprising:

storing a third data on a third digit line in a third memory cell that is coupled to the third digit line responsive to a second word line in an active state; and sensing a voltage of the first digit line at a first sensing node of a sense amplifier when the first memory cell is in a data mode.

6. The method of claim 4, further comprising:

coupling a third memory cell to the first digit line; and storing the first data on the first digit line responsive to a second word line in an active state, the second word line being different from a first word line that is the word line, wherein the second word line is in the active state simultaneously with the first word line.

7. An apparatus, comprising:

a first digit line configured to provide a first signal;

a first switch coupled between the first digit line and a first power potential and configured to couple the first digit line to the first power potential responsive to a control signal in an active state in a reference mode;

a second digit line configured to provide a second signal;

a second switch coupled between the second digit line and a second power potential and configured to couple the second digit line to the second power potential responsive to the control signal in the active state in the reference mode;

a word line configured to provide a third signal in an active state in a refresh operation;

a first memory cell including:
a first capacitor; and
a third switch coupled between the first digit line and the first capacitor and configured to couple the first digit line to the first capacitor responsive to the third signal;

a second memory cell including:
a second capacitor; and
a fourth switch coupled between the second digit line and the second capacitor and configured to couple the second digit line to the second capacitor responsive to the third signal;

a sense amplifier including a first sensing node and a second sensing node and configured to sense a voltage of the first sensing node having a first logic level in reference to a reference voltage of the second sensing node and further configured to provide an amplified voltage having the first logic level to the first sensing node and to provide an amplified voltage having a second logic level opposite to the first logic level to the second sensing node;

a first isolation switch configured to couple the first digit line to the second sensing node; and a second isolation switch configured to couple the second digit line to the second sensing node.

8. The apparatus of claim 7, wherein the first memory cell and the second memory cell are ferroelectric memory cells and the first capacitor and the second capacitors are ferroelectric capacitors.

9. The apparatus of claim 7, wherein the control signal is set to the active state after sensing the voltage of the first sensing node in a data mode.

10. The apparatus of claim 9, wherein the third signal is set to an active state after the control signal is in the active state.

11. The apparatus of claim 7, wherein the first isolation switch and the second isolation switch are configured to activate prior to sensing the voltage of the first sensing node.

12. The apparatus of claim 7 further comprising:

a third digit line configured to provide a fourth signal;

a third isolation switch configured to couple the third digit line to the first sensing node;

a first word line that is the word line;

a second word line configured to provide a fifth signal, a third word line configured to provide a sixth signal;

a third memory cell including:
a third capacitor; and
a fifth switch coupled between the third digit line and the third capacitor and configured to couple the third digit line to the third capacitor responsive to the fifth signal when the third memory cell is in a data mode;

a fourth memory cell including:
a fourth capacitor; and
a sixth switch coupled between the third digit line and the fourth capacitor and configured to couple the third digit line to the fourth capacitor responsive to the sixth signal when the fourth memory cell is in a pooling mode, wherein the third capacitor is configured to store data in the data mode responsive to a voltage of the third digit line and an activation of the second word line, and wherein the fourth capacitor is configured to store data in the pooling mode responsive to the voltage of the third digit line and an activation of the third word line.

13. The apparatus of claim 12, wherein the third isolation switch is configured to activate and deactivate prior to sensing.

14. The apparatus of claim 12, further comprising:
a fourth digit line configured to provide a seventh signal;
a seventh switch coupled between the fourth digit line and the first power potential and configured to couple the fourth digit line to the first power potential responsive to a second control signal in an active state, the second control signal being different from a first control signal that is the control signal;
a fourth isolation switch configured to couple the fourth digit line to the first sensing node;
a fifth memory cell including:
a fifth capacitor; and
an eighth switch coupled between the fourth digit line and the fifth capacitor and configured to couple the fourth digit line to the fifth capacitor responsive to the fifth signal;
a fifth digit line configured to provide an eighth signal;
a ninth switch coupled between the fifth digit line and the second power potential and configured to couple the fifth digit line to the second power potential responsive to the second control signal in the active state;
a fifth isolation switch configured to couple the fifth digit line to the first sensing node; and
a sixth memory cell including:
a sixth capacitor; and
a tenth switch coupled between the fifth digit line and the sixth capacitor and configured to couple the fifth digit line to the sixth capacitor responsive to the fifth signal.

15. The apparatus of claim 14, wherein the fourth isolation switch and the fifth isolation switch are configured to activate after sensing.

16. A memory refreshing method, comprising:
providing a first signal to a first digit line;
providing a second signal to a second digit line;
activating a first switch between the first digit line and a first power potential by providing a control signal in an active state in the active state to couple the first digit line and the first power potential;
activating a second switch between the second digit line and a second power potential by providing the control signal in the active state to couple the second digit line and the second power potential;
providing a third signal to a first word line in a refresh operation;
activating a third switch in a first memory cell between the first digit line and a first capacitor in the first memory cell to couple the first digit line to the first capacitor responsive to the third signal when the first memory cell is in a reference mode;
activating a fourth switch in a second memory cell between the second digit line and a second capacitor in the second memory cell to couple the second digit line to the second capacitor responsive to the third signal when the second memory cell is in a reference mode; and
activating a first isolation switch and a second isolation switch, wherein the first isolation switch is configured couple the first digit line to a reference sensing node of a sense amplifier, and wherein the second isolation switch is configured couple the second digit line to the reference sensing node of the sense amplifier.

17. The method of claim 16, further comprising:
sensing a voltage of a data sensing node of the sense amplifier; and
setting the control signal to the active state.

18. The method of claim 17, further comprising setting the third signal to an active state after the control signal is set to the active state.

19. The method of claim 18, further comprising activating the first isolation switch and the second isolation switch prior to sensing the voltage of the data sensing node.

20. The method of claim 19, further comprising:
providing a fourth signal to a third digit line;
providing a fifth signal to a second word line;
providing a sixth signal to a third word line;
activating a third isolation switch to couple the third digit line to the data sensing node;
activating a fifth switch in a third memory cell between the third digit line and a third capacitor in the third memory cell to couple the third digit line to the third capacitor responsive to the fifth signal when the third memory cell is in a data mode;
activating a sixth switch in a fourth memory cell between the third digit line and a fourth capacitor in the fourth memory cell to couple the third digit line to the fourth capacitor responsive to the sixth signal when the fourth memory cell is in a pooling mode;
storing data in the third capacitor in the data mode responsive to a voltage of the third digit line and an activation of the second word line; and
storing the data in the fourth capacitor in the pooling mode responsive to the voltage of the third digit line and an activation of the third word line.

21. The method of claim 20, further comprising activating and deactivating the third isolation switch prior to sensing the data sensing node.

22. The method of claim 20, further comprising:
providing a seventh signal to the fourth digit line;
providing an eighth signal to a fifth digit line;
activating a seventh switch coupled between the fourth digit line and the first power potential by a second control signal in an active state to couple the fourth digit line to the first power potential, the second control signal being different from a first control signal that is the control signal;
activating a fourth isolation switch to couple the fourth digit line to the data sensing node;
activating an eighth switch in a fifth memory cell coupled between the fourth digit line and a fifth capacitor in the fifth memory cell to couple the fourth digit line to the fifth capacitor responsive to the fifth signal;
activating a ninth switch coupled between the fifth digit line and the second power potential to couple the fifth digit line to the second power potential responsive to the second control signal in the active state;
activating a fifth isolation switch to couple the fifth digit line to the data sensing node; and
activating a tenth switch in a sixth memory cell coupled between the fifth digit line and a sixth capacitor in the sixth memory cell to coupling the fifth digit line to the sixth capacitor responsive to the fifth signal.

23. The method of claim 22, further comprising activating the fourth isolation switch and the fifth isolation switch after sensing the data sensing node.

* * * * *